United States Patent [19]

Waanders et al.

[11] Patent Number: 4,460,842

[45] Date of Patent: Jul. 17, 1984

[54] PIEZOELECTRIC DEVICE WITH HIGH, CONSTANT PRELOAD FORCE

[75] Inventors: Jan W. Waanders; Herman F. van Heek; Roger A. Colson; David J. Perduijn, all of Eindhoven, Netherlands

[73] Assignee: U.S. Philips Corporation, New York, N.Y.

[21] Appl. No.: 447,084

[22] Filed: Dec. 6, 1982

[30] Foreign Application Priority Data

Dec. 8, 1981 [NL] Netherlands ................. 8105502

[51] Int. Cl.³ .............................................. H01L 41/08
[52] U.S. Cl. ..................................... 310/338; 310/329; 310/328
[58] Field of Search ............... 310/334, 335, 337, 329, 310/338, 328

[56] References Cited

U.S. PATENT DOCUMENTS

| | | | |
|---|---|---|---|
| 3,075,099 | 1/1963 | Shoor | 310/329 |
| 3,145,311 | 8/1964 | Dickey | 310/329 |
| 3,171,989 | 3/1965 | Hatschek | 310/338 |
| 3,364,368 | 1/1968 | Sonderegger | 310/338 |
| 3,482,121 | 12/1969 | Hatschek | 310/329 |

Primary Examiner—Mark O. Budd
Attorney, Agent, or Firm—David R. Treacy

[57] ABSTRACT

A piezoelectric device, comprising a number of polarizable ceramic plates 1 which are stacked with intermediate metal plates which serve as electrodes. The stack is subjected to a large amount of preload by a preloading element having a relatively flat spring-force characteristic over the piezoelectric operating range of the device which is formed by a cylindrical housing having two sets of parallel pairs of slots 7, 10, rotationally displaced by 90 degrees, the preloading force being applied to the stack by threaded end plugs 4 and 5. The ceramic plates are polarized only after assembly and preloading.

7 Claims, 4 Drawing Figures

PIEZOELECTRIC DEVICE WITH HIGH, CONSTANT PRELOAD FORCE

The invention relates to a method of manufacturing a piezoelectric device in which a plurality of flat plates of a polarizable piezoceramic material are stacked with an intermediate metal plate between each pair of plates, after which the stack is provided at both ends with an end plate, the two end plates being mechanically interconnected by means of one or more preloading elements arranged to urge the end plates towards one another, so that the stack of plates is mehanically preloaded, the metal plates being connected in alternation to a respective one or other of two terminal electrodes.

A piezoelectric device of the kind which forms the subject of the present invention is described in U.S. Pat. No. 2,473,835. The known device comprises a stack of piezoceramic plates which are arranged in a cylindrical shell which bears against the side of the stack without free play. In the known device vibrations occur in a direction transverse with respect to the central axis of the stack and the shell is provided with an annular groove at both ends, in order to minimize the effect with respect to the end plates.

In a further known device disclosed in British Pat. No. 1,387,323 length variations can occur in a stack of ceramic plates in the axial direction of the stack. Because such length variations can be transmitted to the environment via the end plates, it is very important that these plates contact the stack without free play; and that any free play within the stack should also be avoided as far as possible. In order to achieve this object, the plates are urged against the stack with a preload. For this purpose use is made of a cylindrical sleeve which is connected to the end plates and which is stretched until the desired preload is provided.

It is also known from practice to preload the stack by means of a central bolt, the end plates being urged against the stack by means of nuts.

The high rigidity of said cylindrical shell as well as of the central bolt is a drawback; any variation in the length of the sleeve or the bolt will be accompanied by a comparatively large increase of the applied force. The piezoelectric stack, when energized, should elongate in opposition to this force which is, of course, difficult. The rigidity of the preloading sleeve or the bolt thus reduces the effectiveness of the device.

It is a furher drawback of the known devices that their manufacture is comparatively expensive; this is partly due to the fact that the plates are customarily provided with metal electrodes and thereupon polarized prior to assembly.

It is an object of the invention to provide an improved method of manufacturing a device of the kind set forth which can offer a form of construction which is cheaper and better than that of the known device.

According to the invention there is provided a method of manufacturing a piezoelectric device in which a plurality of flat plates of a polarizable piezoceramic material are stacked with an intermediate metal plate between each pair of plates, after which the stack is provided at both ends with an end plate, the two end plates being mechanically interconnected by means of one or more preloading elements arranged to urge the end plates towards one another, so that the stack of plates is preloaded, the metal plates being connected in alternation to a respective one or other of two terminal electrodes, characterized in that the ceramic plates are stacked in an unpolarized condition, the metal plates being brought into direct contact with the ceramic material, after which a preloading element is applied such that it exerts a relatively large amount of preload on the stack and exhibits a relatively flat spring-characteristic, as herein defined, after which the ceramic plates are polarized by the application of the necessary voltage to the electrodes, if necessary in combination with the application of heat to the device. A relatively flat spring-characteristic is to be understood herein to relate to a spring-like restoring force which does not vary substantially, i.e. for example by no more than about 20%, over the working range of extension of the piezoelectric stack.

As a result of the use of a preloading element having a relatively flat spring-characteristic over the piezoelectirc working range, a relatively large amount of preload can be applied. A relatively large amount of preload is to be understood herein as that which is sufficient substantially to overcome any free play in the stack which free play can thus be very effectively reduced or eliminated. It is also possible to use plates which are not provided with electrodes and to polarize the plates after assembly. The relatively large amount of preload is therefore further to be understood herein as that which is also sufficient substantially to counteract modifications in the shape of the plates during polarization and, should any such modification occur, to urge the intermediate metal plates so firmly against the ceramic plates that adequate contact can always be ensured between the metal plates and the ceramic plates without the need for metallization of the surfaces of the ceramic plates.

When e.g. the materials described in Netherlands Patent Application 7903964 and in the equivalent European Patent Application Ser. No. 019337, are used for the ceramic plates, polarization may be performed at room temperature. When other materials are used, it may be necessary to increase the temperature of the device to a slightly higher value during polarizaton.

The invention also relates to a device manufactured by means of the method and also to an improved device which comprises a plurality of stacked, flat plates of a polarizable piezoceramic material which are arranged between two end plates which are mechanically interconnected by means of one or more preloading elements so that the stack of plates is subject to a preload, a thin metal plate being arranged between each pair of neighbouring plates, the metal plates being connected in alternation to a respective one of two terminal electrodes. Such a device in accordance with the invention is characterized in that each of the metal plates is in direct contact with the ceramic material of the relevant flat plates, the preloading element exerting a relatively large amount of preload and having a relatively flat spring-characteristic as herein defined.

A furter embodiment of the device in accordance with the invention is characterized in that the preloading element is formed by a cylindrical sleeve which is provided, in each of a first set of spaced planes which extend transversely with respect to the central axis of the sleeve, with two cut-out regions which are situated on either side of bridging regions lying in a first diametric axial plane and which is also similarly provided in each of a second set of spaced planes extending transversely with respect to the central axis of the sleeve and situated in alternation between adjacent planes forming said first set, with two cut-out regions which are situated on either side of bridging regions lying in a second diametric axial plane, the two said diametric axial planes being inclined to one another.

Thus, a cylindrical preloading sleeve is provided which can be very rugged in the radial direction, which is capable of producing the necessary preload in the axial direction, and which has a relatively flat spring-characteristic, as herein defined. This means that the stack of plates can be subjected to a substantial amount of preload, so that free play is reduced or substantially eliminated, whilst a piezoelectric increase in length will not be opposed by an inadmissibly large increase in spring force.

Inter alia due to the fact that the preload must remain limited in the known forms of construction, the end faces of each of the ceramic plates used in these constructions were provided with a thin metal layer, for example, a thin layer of silver, for example, by vapour deposition, so that adequate contact is provided with the electrodes even for a small amount of preload. The electrodes are then formed by two metal foils which are wrapped between the ceramic plates in alternation. The metallization of the end faces of each of the ceramic plates is a very laborious and hence expensive operation, and also has the drawback that a continued diffusion of metal within the ceramic material often causes short circuits between the two end faces.

These drawbacks are reduced or overcome in a device in accordance with the invention in that each of the metal foils is in direct contact with the ceramic material of the plates. This is possible because a greater amount of preload is permissible which urges the metal foils so firmly against the ceramic plate that intimate contact is thereby achieved between the electrodes and the ceramic plates even without the presence of an applied metal layer.

It is a further advantage of this device that the ceramic plates can be assembled in the device in the unpolarized condition, so that the customary polarization of the plates in advance is no longer necessary. Should the polarization disappear for some reason during operation, it can be readily restored, without disassembly, by application of the desired voltage to the electrodes accompanied, if necessary, by raising the temperature of the device to the necessary value.

An embodiment of the invention will now be described by way of example, with reference to the accompanying drawings, of which:

Figures 1, 2:
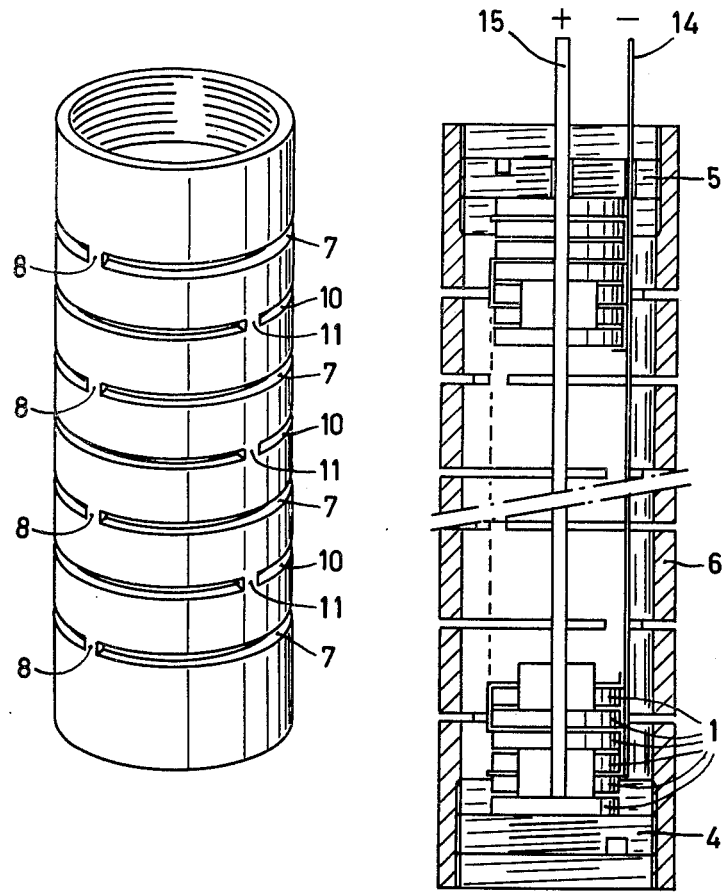
FIG. 1 is a diagrammatic sectional view of a piezoelectric device in accordance with the invention and FIGS. 2 and 3 are perspective views of the cylindrical preloading sleeve and the stack of piezoelectric plates, respectively, of the device shown in FIG. 1.
Figure 3:
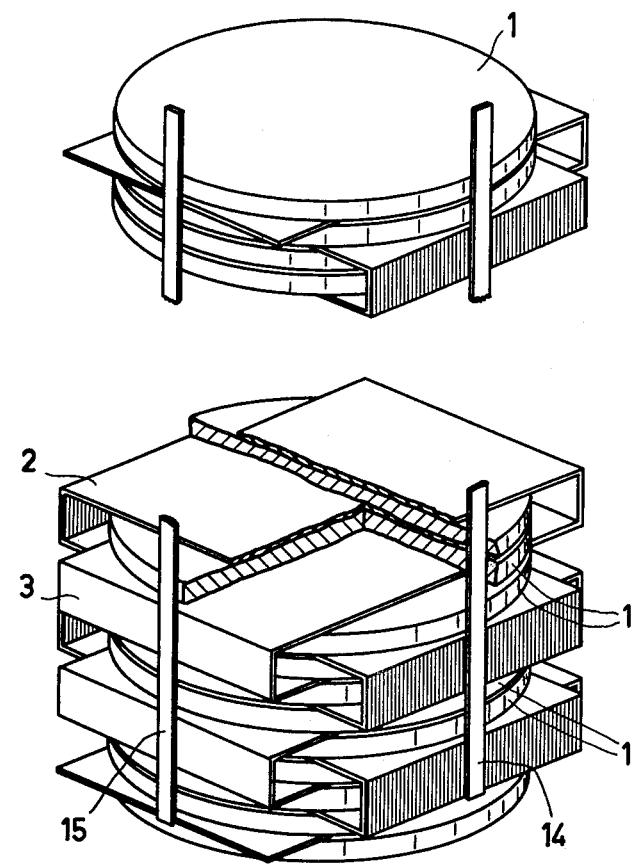

The reference numeral 1 in the drawing denotes a number of stacked piezoceramic plates.

Metal foils 2 and 3 which cross one another at an angle of 90° are passed between adjacent ceramic plates 1 in an alternating manner so that one end face of each plate contacts one foil, whilst its other end face contacts the other foil. The metal foils contact voltage conductors 14 and 15 which are fed out via a threaded end plug 5.

The stack of plates 1 is arranged between two threaded end plugs 4 and 5 which serve as end plates.

The threaded end plugs 4 and 5 are screwed into a cylindrical preloading sleeve 6.

In order to impart a spring-characteristic (i.e. the relationship between spring force and extension) to the sleeve 6 which is relatively flat with the piezo-electric operating range for the desired preload, the sleeve is provided with a first set of circumferentially extending cut-out regions 7 of similar orientation about the axis of the sleeve 6. which are situated in spaced planes extending transversely with respect to the central axis of the sleeve and which cut the sleeve from both sides so that two bridging portions 8 remain. All the bridging portions 8 are situated in a first diametric axial plane.

The sleeve 6 is also provided with a second set of circumferentially extending cut-out regions 10 of a mutually similar orientation about the axis of the sleeve 6, which is different from that of the cut regions 7, and which regions 10 also cut the sleeve from both sides so that two bridging portions 11 remain which are situated in a second diametric axial plane which extends substantially at right angles to the plane in which the bridging portions 8 are situated.

Thus, a preloading sleeve is provided which is very rigid in a radial direction and which offers adequate protection to the stack of ceramic plates. The sleeve is capable of exerting a relatively large amount of preload in the axial direction, the spring-characteristic being nevertheless comparatively flat, over piezoelectric operating range of the device, which means that a variational extension is only accompanied by a relatively small increase in the applied force.

Because a large amount of preload can thus be applied, the electrodes 2 and 3 may contact the ceramic plates directly without the need for a previous deposition of metal surfaces thereon. The relatively large amount of preload will urge the electrodes into the ceramic material of the plates to correspond in effect to that of the metal of plated electrodes. After assembly, the ceramic plates can be polarized by application of the necessary voltage to the electrodes 14 and 15.

In a practical embodiment, the ceramic stack consisted of 100 plates each having an outer diameter of 10 mm d a thickness of 0.5 mm. The electrodes were made of a copper foil having a thickness of $20\mu$ and a width of 7 mm. The preloading sleeve had an outer diameter of 20 mm and a wall thickness of 2 mm.

The rigidity of the sleeve amounted to approximately $2.10^6 Nm^{-1}$ and a preload of 1000 N was exerted on the stack by the sleeve.

In response to a voltage difference of 800 V across the electrodes, this device produced a length variation of $50\mu$ in approximately $100\mu$.

The advantages of a device in accordance with the invention can be summarized as follows: a high efficiency, a firm solid and play-free construction substantially devoid of free play as a result of relatively large amount of the mechanical preload without an inadmissible amount of opposition from an increasing spring force during normal operation, a cheap form of construction resulting from the use of simple components and notably from the use of ceramic plates which have not had to be preprocessed (i.e. have not been polarized and have not had a metal layer applied thereto), and a low electrical capacitance, so that the power consumption of the device is low.

The ceramic plates in the device in accordance with the invention need not be polarized in advance; polarization can be performed in the assembled condition by raising the temperature of the entire device to the necessary value, followed by application of the necessary voltage to the electrodes.

Figure 4:
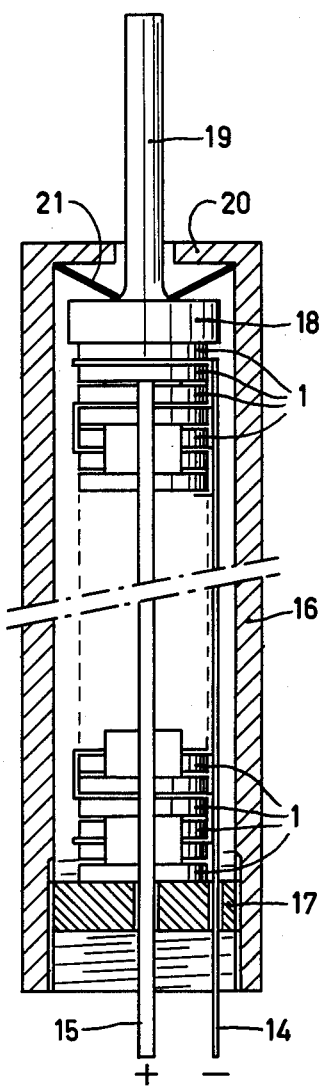
FIG. 4 shows a further embodiment of a piezoelectric device.

FIG. 4 shows how the stack of piezo-ceramic plates 1 is surrounded by a cylindrical sleeve 16. The stack 1 is enclosed by a threaded end plug 17 and an end-plate 18 which is provided with an element 19 which is guided through the end face 20 of the sleeve 16.

Between the end face 20 and the end-plate 18 lie a disc spring 21.

In this embodiment pressure can be applied on the stack 1 by screwing end plug 17 into the cylindrical sleeve. n9

What is claimed is:

1. A piezoelectric device comprising two end plates, a plurality of stacked, flat plates of a polarizable piezoceramic material arranged between said two end plates, a plurality of thin metal plates arranged one each between respective adjacent piezoceramic plates, two electric conductors, means for electrically connecting the metal plates in alternation to a respective one of said two conductors, and means for mechanically interconnecting said end plates, said means including a preloading element for subjecting the stack of plates to a preload force, characterized in that the device is so arranged that each of said metal plates is held in direct contact with the piezoceramic material of the adjoining piezoceramic flat plates by the preloading force only, and the preloading element is arranged to provide a relatively large preload force, and to have a flat spring characteristic over the working range of extension of the piezoelectric device.

2. A device as claimed in claim 1, characterized in that said flat spring characteristic corresponds to a variation of force with respect to the preload force of at most 20% over the working range of extension.

3. A device as claimed in claim 1, characterized in that said flat spring characteristic corresponds to a variation of force with respect to the preload force of at most 10% over the working range of extension.

4. A device as claimed in claim 1, characterized in that the preload element is a cylindrical sleeve having a central axis and a plurality of pairs of axially spaced cicrumferentially extending cut-outregions formed in the sleeve, each pair of cut-out regions arranged so as to define a pair of bridging regions in the sleeve, the bridging regions of a pair being disposed diametrically and symmetrically about said central axis, the diameter defined by one pair of bridging regions being inclined with respect to a plane defined by the axis and the diameter defined by the axially next adjoining pair of bridging regions.

5. A device as claimed in claim 4, characterized in that each pair of cut-out regions is symmetrical about a plane perpendicular to the central axis, the diameters defined by the pairs of bridging regions of one set of alternate cut-out regions lies in a plane including said axis, and the diameters defined by the other pairs of bridging regions lie in a plane which includes the axis and is transverse to the plane defined by said alternate regions.

6. A device as claimed in claim 5, characterized in that said flat spring characteristic corresponds to a variation of force with respect to the preload force of at most 20% over the working range of extension.

7. A device as claimed in claim 5, characterized in that said flat spring characteristic corresponds to a variation of force with respect to the preload force of at most 10% over the working range of extension.

* * * * *